US011661780B2

(12) United States Patent
Ho (10) Patent No.: US 11,661,780 B2
(45) Date of Patent: May 30, 2023

(54) AUTOMATIZED MECHANICAL OPENING/CLOSING DEVICE OF OVEN

(71) Applicant: WEISUN INDUSTRIAL CO., LTD., New Taipei (TW)

(72) Inventor: Ko-Chien Ho, New Taipei (TW)

(73) Assignee: Weisun Industrial Co., Ltd., New Taipei (TW)

( * ) Notice: Subject to any disclaimer, the term of this patent is extended or adjusted under 35 U.S.C. 154(b) by 206 days.

(21) Appl. No.: 17/128,538

(22) Filed: Dec. 21, 2020

(65) Prior Publication Data

US 2022/0195774 A1  Jun. 23, 2022

(51) Int. Cl.
  *E05D 15/56* (2006.01)
  *E05F 15/56* (2015.01)
  *F24C 15/02* (2006.01)
  *H05K 3/22* (2006.01)

(52) U.S. Cl.
  CPC .............. *E05D 15/56* (2013.01); *E05F 15/56* (2015.01); *F24C 15/026* (2013.01); *E05Y 2201/454* (2013.01); *E05Y 2201/684* (2013.01); *E05Y 2400/44* (2013.01); *E05Y 2900/608* (2013.01); *H05K 3/227* (2013.01)

(58) Field of Classification Search
  CPC .... E05D 15/56; E05F 15/56; E05Y 2201/454; E05Y 2201/684; E05Y 2400/44; E05Y 2900/608; F24C 15/026; H05K 3/227
  See application file for complete search history.

(56) References Cited

U.S. PATENT DOCUMENTS 8,720,430 B2 * 5/2014 Schuecker .......... E05B 65/0876
                                                    126/192
8,821,693 B2 * 9/2014 Kim ........................ C10B 25/12
                                                    202/245

FOREIGN PATENT DOCUMENTS

CN            296581772      * 10/2017

* cited by examiner

*Primary Examiner* — Carl J Arbes
(74) *Attorney, Agent, or Firm* — Rosenberg, Klein & Lee (57) ABSTRACT

An automatized mechanical opening/closing device is mounted to an oven mouth of an oven device and includes an outer door frame assembly, an inner door frame assembly, a door panel, a first driving device, and a plurality of second driving devices. The first driving device and the second driving devices are set in electric connection with a control platform is, so that the first driving device is operable to drive the inner door frame assembly to move inside the outer door frame assembly in an X-axis direction and the second driving devices is operable to drive the door panel to move inside the inner door frame assembly in a Y-axis direction. The control platform can be used to set automatized opening and closing operations of the oven mouth of the oven device to thereby save human labor and to reduce material damage due to manual operation.

16 Claims, 9 Drawing Sheets

AUTOMATIZED MECHANICAL OPENING/CLOSING DEVICE OF OVEN

FIELD OF THE INVENTION

The present invention relates to a door of an oven, and more particular to an automatized mechanical opening/closing device of an oven that opens and closes the oven without being operated manually.

BACKGROUND OF THE INVENTION

Fabrication of products in various fields requires a baking operation, and the baking operation is employed to for example make the product dried. Taking a process of fabricating a printed circuit board (PCB) as an example, multiple operations, including ink coating, drying, baking, and cleansing, are involved, among which the baking operation is carried out that heat generated by an oven is applied to bake the printed circuit board that was previously coated with wet ink, so that with such baking, the wet ink is cured and gets securely attached to the printed circuit board. This is an operation that is commonly used in the fabrication of printed circuit boards.

However, a known oven requires manual intervention for opening/closing the oven door or loading or unloading operations. An operator must pull or rotate a door handle of the oven in order to activate the door handle for opening the oven door to allow materials to be deposited into the oven or removed out of the oven. Therefore, the operator has to spend a great effort in carrying out such operations. Further, this may increase the potential risk of damage to the materials due to human errors.

Thus, for the purposes of enhancing fabrication performance and lowering the risk of material damage, equipment automatization has been increasingly desired. For both opening and closing an oven door and loading and unloading the oven, in addition to programming and setting, devices that can be easier to manufacture, assemble, and use must also be provided.

In view of the above, the present invention aims to provide an automatized mechanical opening/closing device of an oven that helps alleviates the above-discussed deficiencies and improve the utilization of industry.

SUMMARY OF THE INVENTION

The primary objective of the present invention is to provide an automatic mechanism opening/closing device of an oven that enables automatic opening and closing of an oven mouth, such that human labor of an operation can be saved and material damages caused by a human labor operation can be avoided during fabrication, and that involves mechanisms that suit the needs for easy manufacturing and assembling.

Thus, to achieve the above objective, the present invention provides an oven automatized mechanical opening/closing device, which is mounted to an oven mouth of an oven device and comprises: an outer door frame assembly, the outer door frame assembly having a first receiving space, the outer door frame assembly having a front side in which an opening is formed and corresponds to the oven mouth; an inner door frame assembly, the inner door frame assembly being movably arranged in the first receiving space, the inner door frame assembly having a second receiving space, a door panel being movably mounted to the second receiving space, the door panel having a size close to a size of the oven mouth; a first driving device, the first driving device being coupled to the outer door frame assembly and the inner door frame assembly to drive the inner door frame assembly to move inside the outer door frame assembly in an X-axis direction; and a plurality of second driving devices, the second driving devices being disposed on an inner side of the inner door frame assembly and coupled to the door panel to drive the door panel to move inside the inner door frame assembly in a Y-axis direction; wherein the first driving device and the second driving devices are in electric connection with a control platform.

In one embodiment, the outer door frame assembly comprises an upper support frame, a lower support frame, and two side-boards, the two side-boards being connected to the upper support frame and the lower support frame respectively at a left side and a right side to form the first receiving space.

In one embodiment, the lower support frame has a top surface that is provided with a photoelectric sensing element, the photoelectric sensing element being in electric connection with the control platform to sense a position of movement of the inner door frame assembly.

In one embodiment, the outer door frame assembly comprises an optical shutter-based protection switch, the optical shutter-based protection switch being in electric connection with the control platform.

In one embodiment, the inner door frame assembly comprises a door frame top board, a door frame bottom board, and a plurality of door frame posts, the door frame top board and the door frame bottom board being respectively arranged at an upper side and a lower side and being parallel to each other, the door frame posts having two ends respectively connected to two sides of the door frame top board and the door frame bottom board to form the second receiving space.

In one embodiment, the door frame top board has a top surface that is provided with a guide roller at each of two ends thereof, the guide rollers being in contact engagement with the upper support frame to prevent shifting and swaying of the inner door frame assembly.

In one embodiment, the lower support frame has a top surface that is provided with a plurality of first rails, the door frame bottom board being movably mounted on the first rails, so that the first rails constrain a moving direction of the inner door frame assembly.

In one embodiment, the first driving device comprises a first driver unit and a first connection plate, the first driver unit being fixed to the upper support frame and is coupled through the first connection plate to the door frame top board, so that the first driver unit drives the inner door frame assembly to move inside the outer door frame assembly in the X-axis direction.

In one embodiment, the first driver unit comprises a rodless cylinder.

In one embodiment, the first connection plate comprises an L-shaped connection plate.

In one embodiment, a surface of the first connection plate that is mounted to the first driver unit is mounted by means of at least one floating joint.

In one embodiment, the second driving devices each comprise a second driver unit and a second connection plate, the second driver unit being fixed to the door frame posts and being coupled through the second connection plate to the door panel, so that the second driver unit drives the door panel to move inside the inner door frame assembly in the Y-axis direction.

In one embodiment, the second driving devices are arranged pairwise to be respectively disposed at upper and lower ends of the door frame posts.

In one embodiment, the second driver unit comprises a pneumatic cylinder.

In one embodiment, the door frame top board and the door frame bottom board are provided, on inner sides thereof, with a plurality of second rails, the second rails being arranged parallel and coupled with sliding units provided on the top and the bottom sides of the door panel.

In one embodiment, the sliding units each comprise a slide block and a third connection plate, the slide block being movably coupled with the second rails, the slide block being connected through the third connection plate to the door panel.

In one embodiment, a stop block is provided at each of a front end and a rear end of the second rails.

In one embodiment, the third connection plate comprises an L-shaped connection plate.

In one embodiment, a surface of the third connection plate that is mounted to the door panel is mounted by means of at least one floating joint.

DETAILED DESCRIPTION OF THE PREFERRED EMBODIMENTS

Embodiments of the present invention will be described below with reference to FIGS. 1-9. The description is not intended to limit the way of embodying the present invention, and is rather provided as an example of the embodiment of the present invention. Further, in the drawings and embodiments, similar or identical reference signs throughout all the drawings refer to identical, substantially identical, or functionally identical parts or elements. The drawings are provided in a simplified form and all the drawings are not made to scale for all the embodiments.

Figure 1:
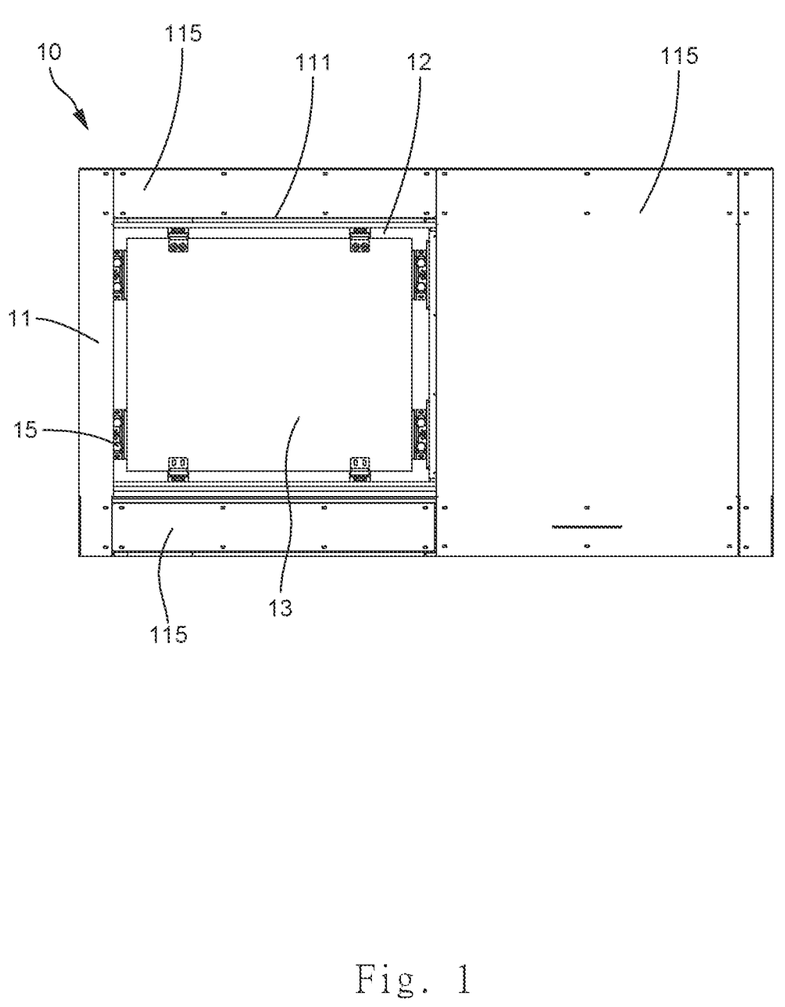
FIG. 1 is a front view showing an automatized mechanical opening/closing device of an oven according to the present invention.
Figure 2:
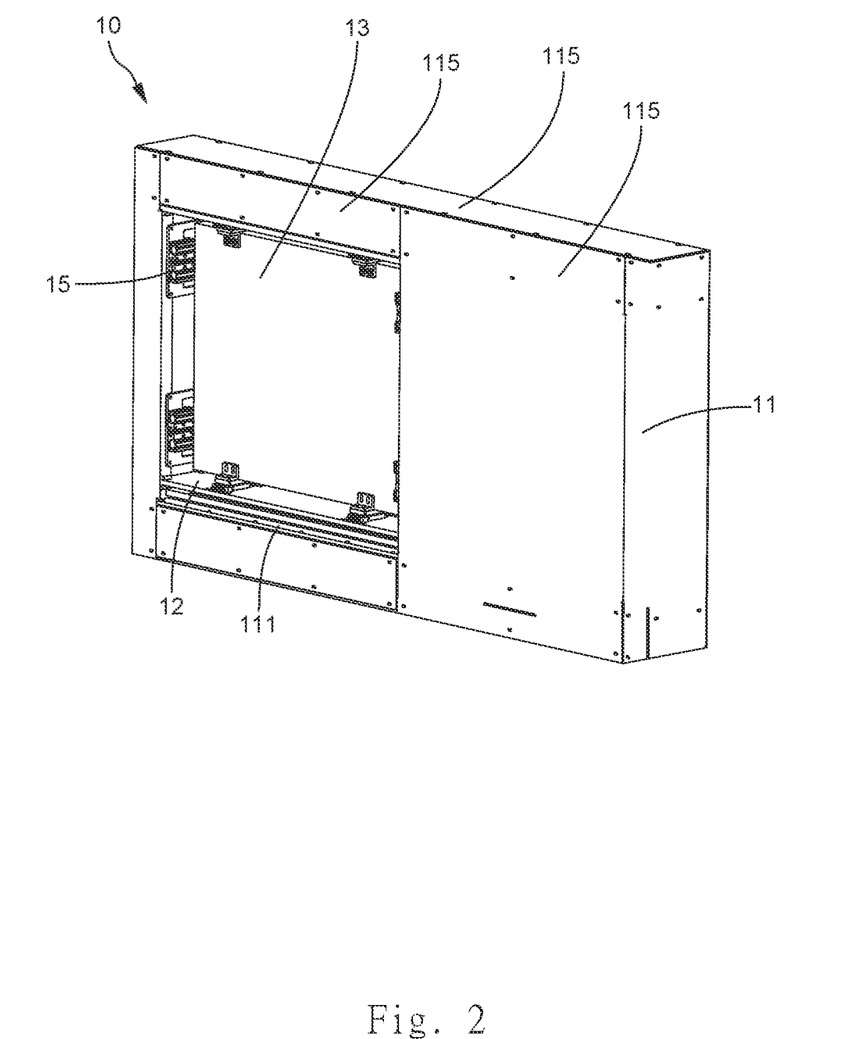
FIG. 2 is a perspective view showing the automatized mechanical opening/closing device according to the present invention.
Figure 3:
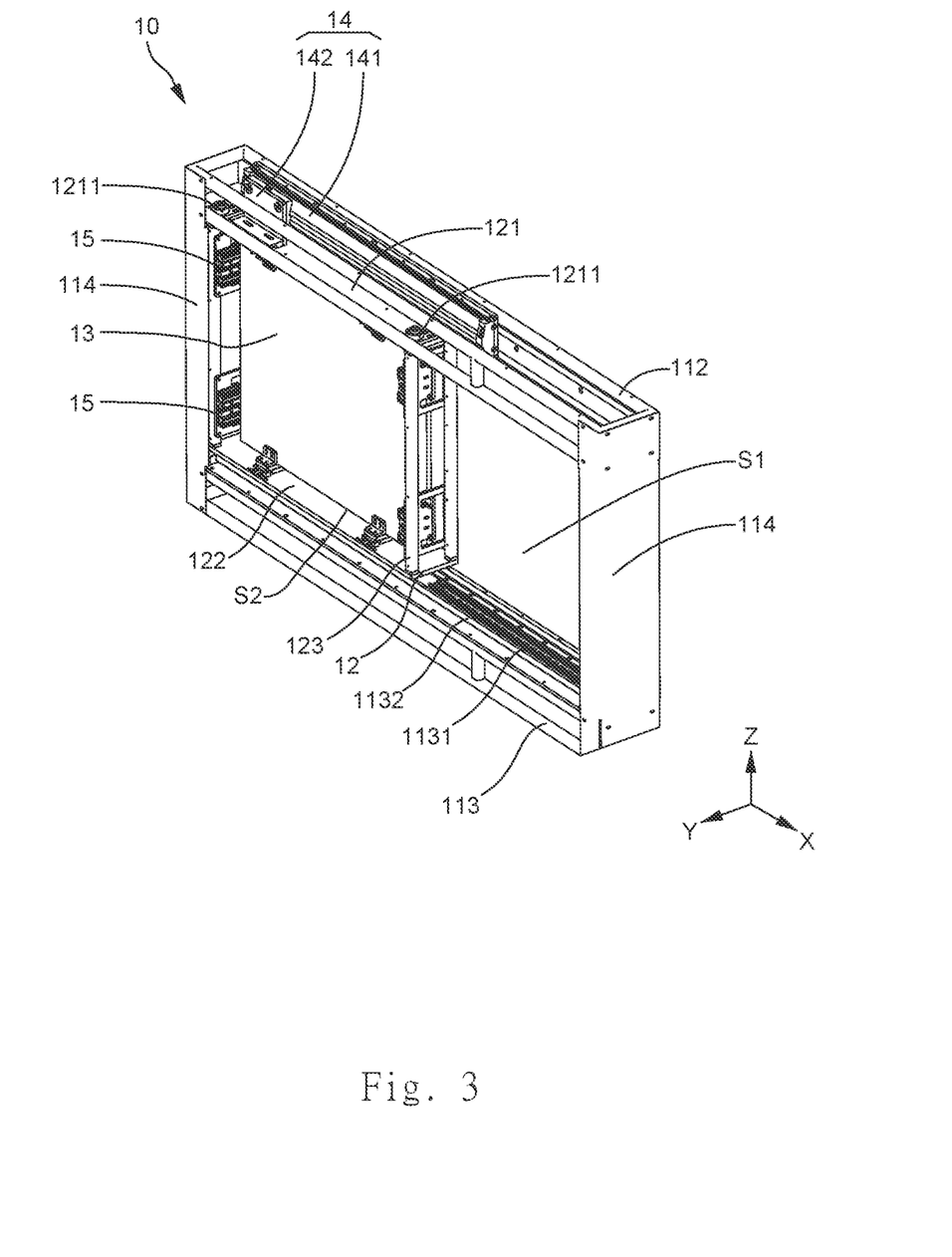
FIG. 3 is a perspective view showing the device of FIG. 2 with shielding plates removed.
Figure 4:
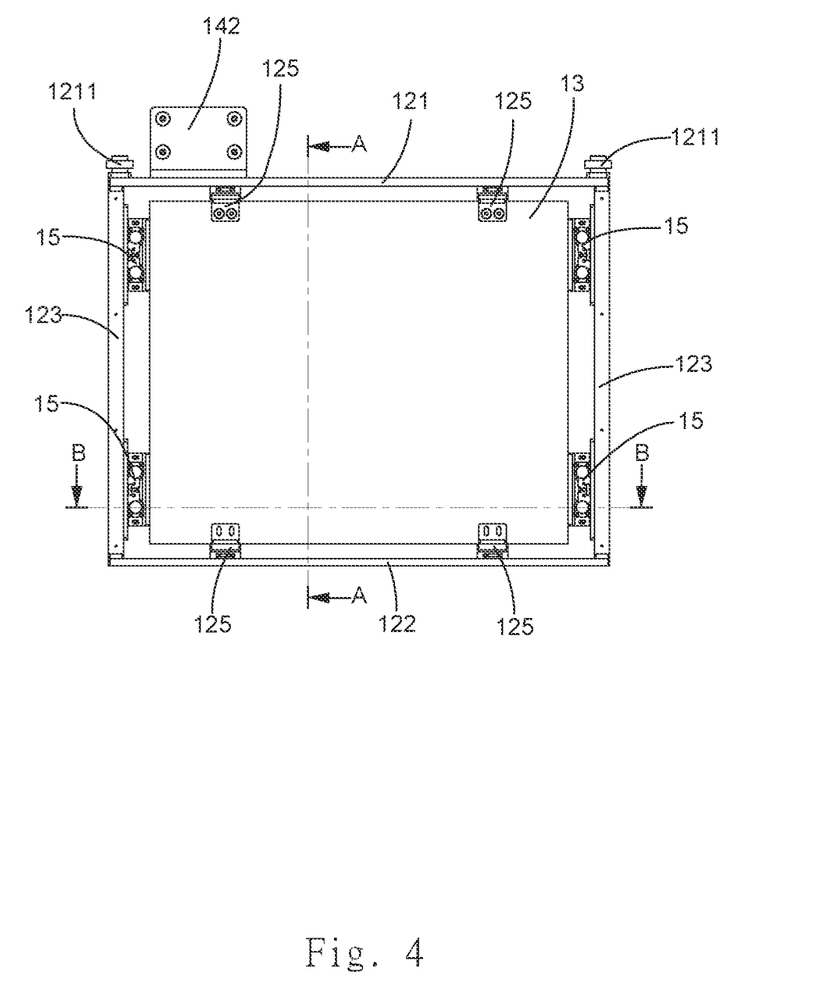
FIG. 4 is a front view showing an inner door frame assembly of the automatized mechanical opening/closing device according to the present invention.

Firstly, referring simultaneously to FIGS. 1-3, the present invention provides an oven automatized mechanical opening/closing device 10, which is mounted to an oven mouth of an oven device (not shown) and comprises: an outer door frame assembly 11, the outer door frame assembly 11 including a first receiving space S1, the outer door frame assembly 11 having a front side in which an opening 111 is formed and corresponds to the oven mouth; an inner door frame assembly 12, the inner door frame assembly 12 being movably arranged in the first receiving space S1, the inner door frame assembly 12 including second receiving space S2, a door panel 13 being movably mounted to the second receiving space S2, the door panel 13 having a size that is close to that of the oven mouth; a first driving device 14, the first driving device 14 being coupled to the outer door frame assembly 11 and the inner door frame assembly 12 and being operable to drive the inner door frame assembly 12 to move inside the outer door frame assembly 11 in an X-axis direction; and a plurality of second driving devices 15, the second driving devices 15 being disposed on an inner side of the inner door frame assembly 12 and coupled to the door panel 13 and being operable to drive the door panel 13 to move inside the inner door frame assembly 12 in a Y-axis direction; wherein the first driving device 14 and the second driving devices 15 are set in electric connection with a control platform (not shown), so that the control platform is operable to set timing of operations of the first driving device 14 and the second driving devices 15 to adjust positions of the inner door frame assembly 12 and the door panel 13 relative to the oven mouth to achieve opening and closing of the oven mouth. For example, an operator may operate the control platform to set operation conditions of the first driving device 14 and the second driving devices 15 as desired, such as operating the first driving device 14 and the second driving devices 15 to open the oven mouth when the oven device has carried out a baking operation at a baking temperature for a period of time or when the oven device has ended a baking operation for a period of time.

Next, referring simultaneously to FIGS. 3-9, detailed descriptions will be provided individually for the outer door frame assembly 11, the inner door frame assembly 12, the first driving device 14, and the second driving devices 15.

The outer door frame assembly 11 comprises an upper support frame 112, a lower support frame 113, and two side-boards 114. The two side-boards 114 are respectively combined with the upper support frame 112 and the lower support frame 113 as being arranged at a left side and a right side so as to form and delimit the first receiving space S1. The outer door frame assembly 11 is provided, on a front side and a rear side thereof, with a plurality of shielding plates 115 to shield and cover the first receiving space S1. The lower support frame 113 has a top surface on which a plurality of first rails 1132 are provided, and a door frame bottom board 122 is movably mounted on the first rails 1132, such that the first rails 1132 constrain a moving direction of the inner door frame assembly 12. The top surface of the lower support frame 113 is further provided with a photoelectric sensing element 1131. The photoelectric sensing element 1131 is in electric connection with the control platform to sense a position to which the inner door frame assembly 12 is moved and transmit a sensing signal to the control platform to notify the control platform of the status of the inner door frame assembly 12. Further, the outer door frame assembly 11 is also provided with an optical shutter-based protection switch (not shown). The optical shutter-based protection switch is in electric connection with the control platform, so that during an operation of opening or closing the oven mouth, if a person or an article is sensed around the oven mouth, the operation can be immediately stopped to prevent damage or injury of the person or the article.

The inner door frame assembly 12 comprises a door frame top board 121, a door frame bottom board 122, and a plurality of door frame posts 123. The door frame top board 121 and the door frame bottom board 122 are arranged on upper and lower sides and are parallel. Two ends of the door frame posts 123 are respectively connected to the door frame top board 121 and the door frame bottom board 122 at two sides in order to form and delimit the second receiving space S2. The door frame top board 121 has a top surface on which a guide roller 1211 is mounted at each of two ends thereof. The guide rollers 1211 may get into contact engagement with the upper support frame 112 to prevent shifting or swaying of the inner door frame assembly 12. Particularly, during closing of the oven mouth, the door panel 13 is moved inward in the Y-axis direction to close the oven mouth, and an outward-pushing reaction force is generated and applied to the inner door frame assembly 12. Due to the bottom of the inner door frame assembly 12 is supported and constrained by the first rails 1132, the top of the inner door frame assembly 12 must be supported through the guide rollers 1211 being in contact engagement with the upper support frame 112 to resist the outward-pushing reaction force to ensure stable operation. Further, during moving of the inner door frame assembly 12 in the X-axis direction, since the guide rollers 1211 are in contact engagement with the upper support frame 112, shifting or swaying of the inner door frame assembly 12 can be suppressed.

The first driving device 14 comprises a first driver unit 141 and a first connection plate 142. The first driver unit 141 is fixed to the upper support frame 112, and is coupled, through the first connection plate 142, to the door frame top board 121, so that the first driver unit 141 may drive the inner door frame assembly 12 to move inside the outer door frame assembly 11 in the X-axis direction. The first driver unit 141 can be a rodless cylinder, and the first connection plate 142 is an L-shaped connection plate. A surface of the first connection plate 142 that is connected to the first driver unit 141 is mounted by using at least one floating joint 161 to prevent undesired deadlocking of the first connection plate 142 and the first driver unit 141.

The second driving devices 15 each comprise a second driver unit 151 and a second connection plate 152. The second driver units 151 are fixed to the door frame posts 123, and are each coupled, through the corresponding second connection plate 152, to the door panel 13. The second driver units 151 may drive the door panel 13 to move inside the inner door frame assembly 12 in the Y-axis direction. The second driver units 151 may each be a pneumatic cylinder. Further, the second driving devices 15 are preferably arranged in a pairwise manner in which the two devices are respectively arranged at upper and lower ends of a corresponding one of the door frame posts 123.

As such, when the first driving device 14 and the second driving devices 15 receive an opening signal from the control platform, the second driving devices 15 first drive the door panel 13 to move outward in the Y-axis direction to separate and detach from the oven mouth, and then, the first driving device 14 drives the inner door frame assembly 12 to move in the X-axis direction toward one side of being distant from the oven mouth to thus open the oven mouth, enabling communication of the oven mouth with an external space and allowing the material to be removed from or deposited into the oven device through the oven mouth. Oppositely, when the first driving device 14 and the second driving devices 15 receive a closing signal from the control platform, the first driving device 14 first drives the inner door frame assembly 12 to move in the X-axis direction toward one side that is adjacent to the oven mouth for approaching and covering the oven mouth, and then, the second driving devices 15 drive the door panel 13 inwards in the Y-axis direction to close the oven mouth, to allow the oven device to start a baking operation for the material deposited therein.

Figure 5:
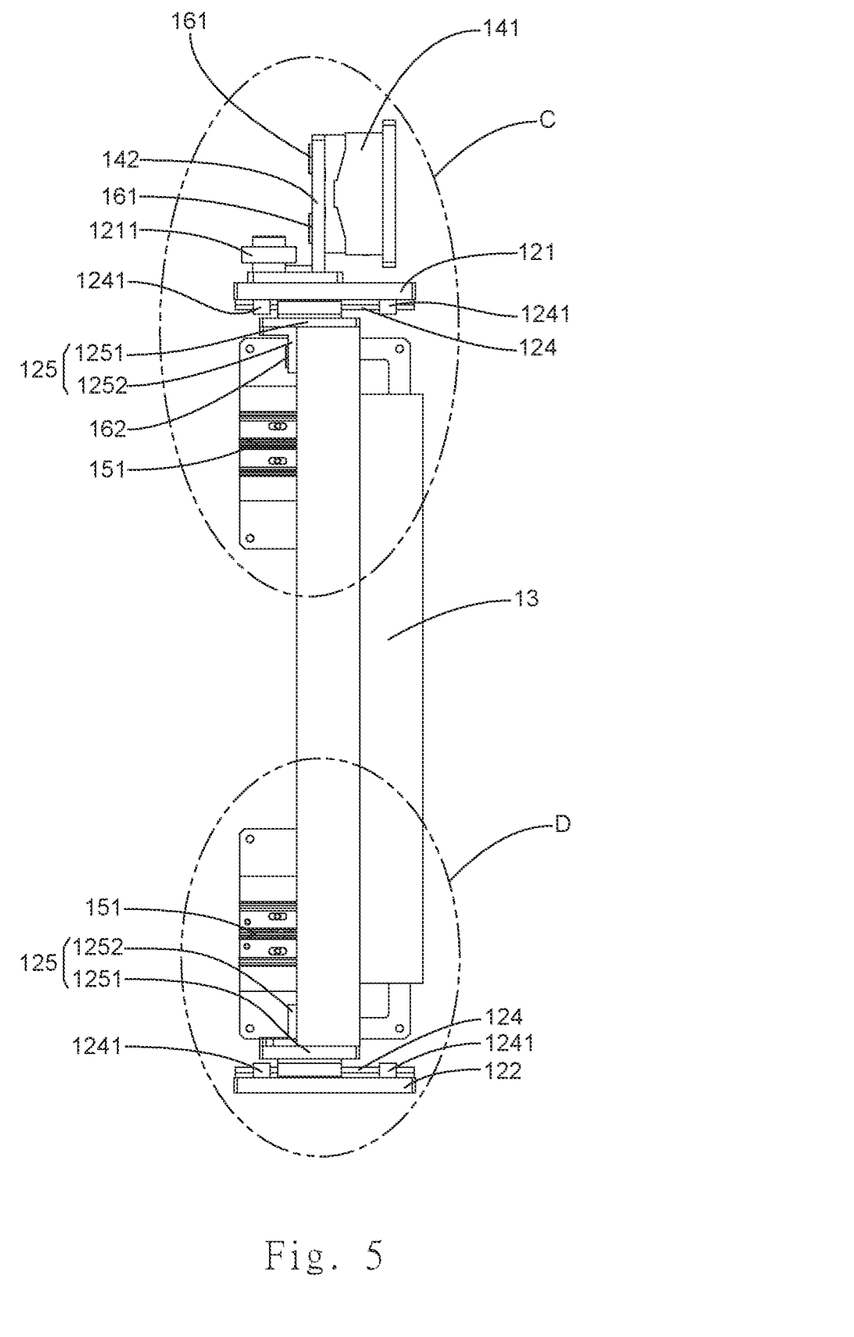
FIG. 5 is a cross-sectional view taken along line A-A of FIG. 4.
Figure 6:
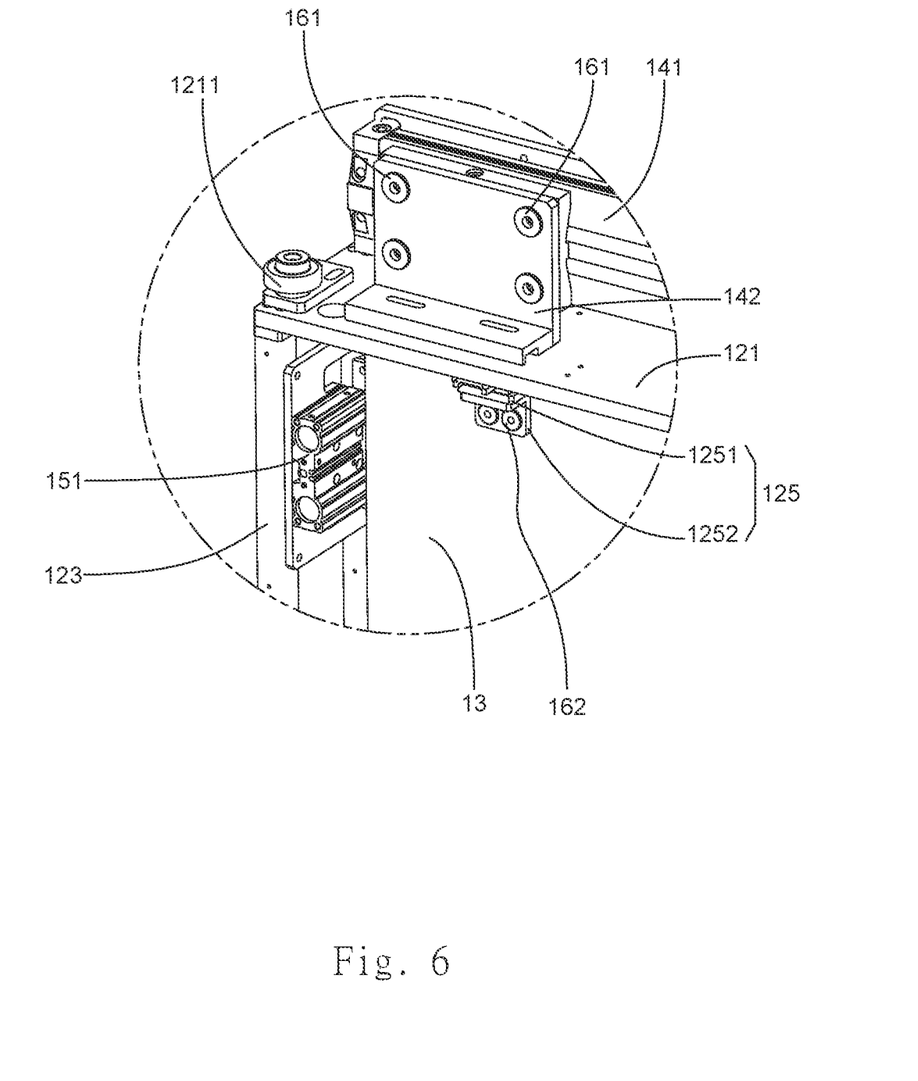
FIG. 6 is an enlarged view of a circled portion "C" of FIG. 5.
Figure 7:
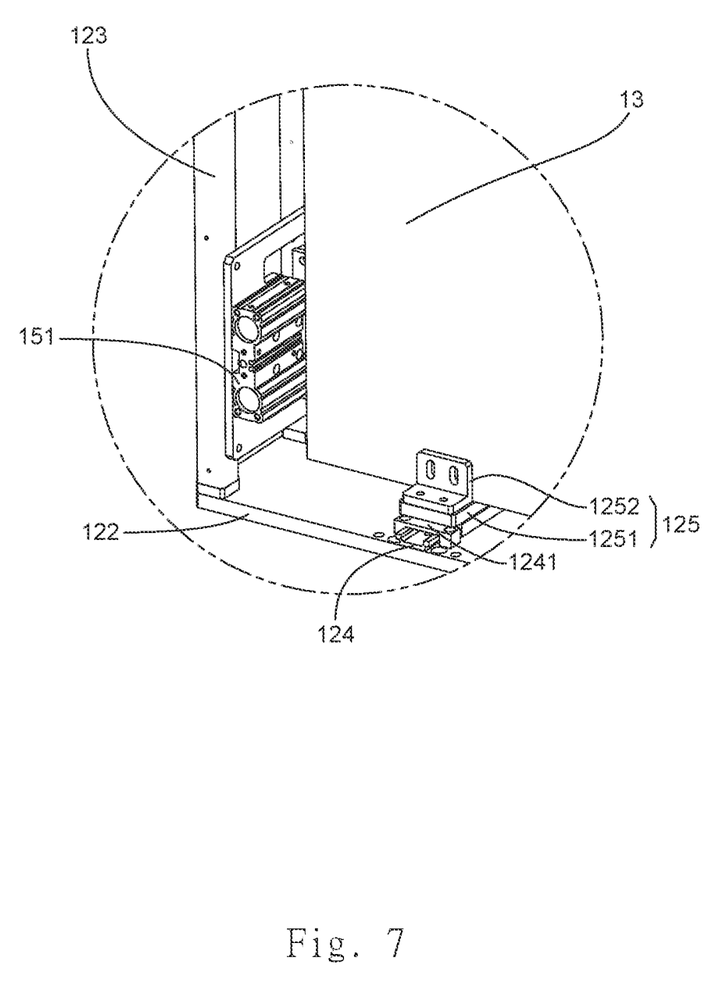
FIG. 7 is an enlarged view of a circled portion "D" of FIG. 5.
Figure 8:
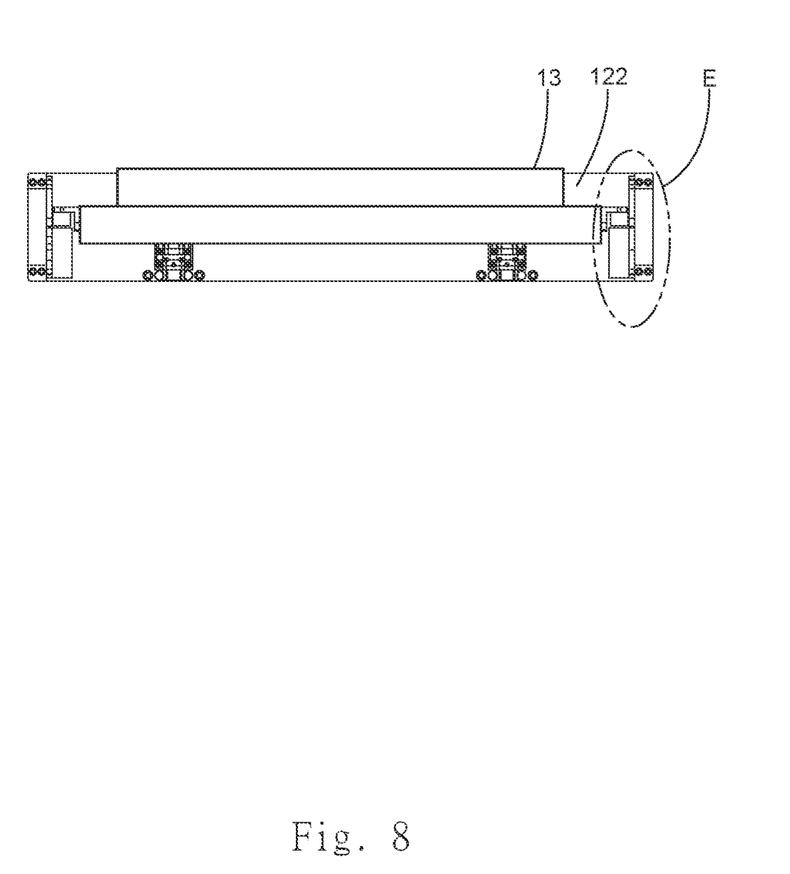
FIG. 8 is a cross-sectional view taken along line B-B of FIG. 4.
Figure 9:
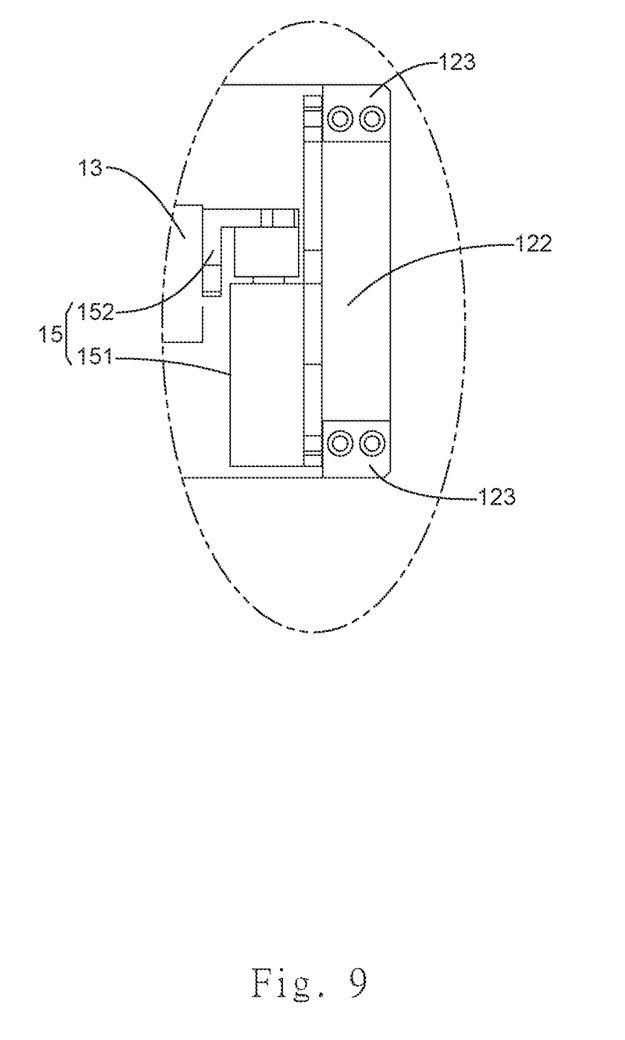
FIG. 9 is an enlarged view of a circled portion "E" of FIG. 8.

Finally, as shown in FIG. 5, the door frame top board 121 and the door frame bottom board 122 are provided, on inner sides thereof, with a plurality of second rails 124. The second rails 124 are arranged parallel and are coupled with sliding units 125 provided on top and bottom sides of the door panel 13. The sliding units 125 each comprise a slide block 1251 and a third connection plate 1252. The slide block 1251 is movably coupled with the second rails 124, and the slide block 1251 is connected through the third connection plate 1252 to the door panel 13. The third connection plate 1252 can be an L-shaped connection plate. A surface of the third connection plate 1252 that is mounted to the door panel 13 is mounted by means of at least one floating joint 162, in order to prevent deadlocking of the third connection plate 1252 and the door panel 13. Further, to prevent the door panel 13 from moving outside a specified range in the Y-axis direction, a stop block 1241 is provided at each of a front end and a rear end of the second rails 124 for constraining a moving range of the door panel 13 in the Y-axis direction.

The present invention provides an automatized mechanical opening/closing device of an oven, which uses the setting made with a control platform to carry out automatized opening and closing operations of an oven mouth of the oven, such that during a production process, human labor of operators can be saved and material damage caused by the operators can be reduced. The present invention also suits the needs for easy manufacturing and easy assembling.

What is claimed is:

1. An automatized mechanical opening/closing device, which is adapted to be mounted to an oven mouth of an oven device, comprising:
   an outer door frame assembly, the outer door frame assembly having a first receiving space, the outer door frame assembly having a front side in which an opening is formed and corresponds to the oven mouth, the outer door frame assembly including an upper support frame, a lower support frame, and two side-boards, the two side-boards being connected to the upper support frame and the lower support frame respectively at a left side and a right side to form the first receiving space;
   an inner door frame assembly, the inner door frame assembly being movably arranged in the first receiving space, the inner door frame assembly having a second receiving space, a door panel being movably mounted to the second receiving space, the door panel having a size close to a size of the oven mouth, the inner door frame assembly including a door frame top board, a door frame bottom board, and a plurality of door frame posts, the door frame top board and the door frame bottom board being respectively arranged at an upper side and a lower side and being parallel to each other, the door frame posts having two ends respectively connected to two sides of the door frame top board and the door frame bottom board to form the second receiving space, the lower support frame having a top surface that is provided with a plurality of first rails, the door frame bottom board being movably mounted on the first rails, so that the first rails constrain a moving direction of the inner door frame assembly;
   a first driving device, the first driving device being coupled to the outer door frame assembly and the inner door frame assembly to drive the inner door frame assembly to move inside the outer door frame assembly 11 in an X-axis direction; and
a plurality of second driving devices, the second driving devices being disposed on an inner side of the inner door frame assembly and coupled to the door panel to drive the door panel to move inside the inner door frame assembly in a Y-axis direction;
wherein the first driving device and the second driving devices are in electric connection with a control platform.

2. The automatized mechanical opening/closing device according to claim 1, wherein the lower support frame has a top surface that is provided with a photoelectric sensing element, the photoelectric sensing element being in electric connection with the control platform to sense a position of movement of the inner door frame assembly.

3. The automatized mechanical opening/closing device according to claim 1, wherein the outer door frame assembly comprises an optical shutter-based protection switch, the optical shutter-based protection switch being in electric connection with the control platform.

4. The automatized mechanical opening/closing device according to claim 1, wherein the door frame top board has a top surface that is provided with a guide roller at each of two ends thereof, the guide rollers being in contact engagement with the upper support frame to prevent shifting and swaying of the inner door frame assembly.

5. An automatized mechanical opening/closing device, which is adapted to be mounted to an oven mouth of an oven device, comprising:
an outer door frame assembly, the outer door frame assembly having a first receiving space, the outer door frame assembly having a front side in which an opening is formed and corresponds to the oven mouth, the outer door frame assembly including an upper support frame, a lower support frame, and two side-boards, the two side-boards being connected to the upper support frame and the lower support frame respectively at a left side and a right side to form the first receiving space;
an inner door frame assembly, the inner door frame assembly being movably arranged in the first receiving space, the inner door frame assembly having a second receiving space, a door panel being movably mounted to the second receiving space, the door panel having a size close to a size of the oven mouth, the inner door frame assembly including a door frame top board, a door frame bottom board, and a plurality of door frame posts, the door frame top board and the door frame bottom board being respectively arranged at an upper side and a lower side and being parallel to each other, the door frame posts having two ends respectively connected to two sides of the door frame top board and the door frame bottom board to form the second receiving space;
a first driving device, the first driving device being coupled to the outer door frame assembly and the inner door frame assembly to drive the inner door frame assembly to move inside the outer door frame assembly 11 in an X-axis direction, the first driving device including a first driver unit and a first connection plate, the first driver unit being fixed to the upper support frame and is coupled through the first connection plate to the door frame top board, so that the first driver unit drives the inner door frame assembly to move inside the outer door frame assembly in the X-axis direction; and a plurality of second driving devices, the second driving devices being disposed on an inner side of the inner door frame assembly and coupled to the door panel to drive the door panel to move inside the inner door frame assembly in a Y-axis direction;
wherein the first driving device and the second driving devices are in electric connection with a control platform.

6. The automatized mechanical opening/closing device according to claim 5, wherein the first driver unit comprises a rodless cylinder.

7. The automatized mechanical opening/closing device according to claim 5, wherein the first connection plate comprises an L-shaped connection plate.

8. The automatized mechanical opening/closing device according to claim 7, wherein a surface of the first connection plate that is mounted to the first driver unit is mounted by means of at least one floating joint.

9. An automatized mechanical opening/closing device, which is adapted to be mounted to an oven mouth of an oven device, comprising:
an outer door frame assembly, the outer door frame assembly having a first receiving space, the outer door frame assembly having a front side in which an opening is formed and corresponds to the oven mouth, the outer door frame assembly including an upper support frame, a lower support frame, and two side-boards, the two side-boards being connected to the upper support frame and the lower support frame respectively at a left side and a right side to form the first receiving space;
an inner door frame assembly, the inner door frame assembly being movably arranged in the first receiving space, the inner door frame assembly having a second receiving space, a door panel being movably mounted to the second receiving space, the door panel having a size close to a size of the oven mouth, the inner door frame assembly including a door frame top board, a door frame bottom board, and a plurality of door frame posts, the door frame top board and the door frame bottom board being respectively arranged at an upper side and a lower side and being parallel to each other, the door frame posts having two ends respectively connected to two sides of the door frame top board and the door frame bottom board to form the second receiving space;
a first driving device, the first driving device being coupled to the outer door frame assembly and the inner door frame assembly to drive the inner door frame assembly to move inside the outer door frame assembly 11 in an X-axis direction; and
a plurality of second driving devices, the second driving devices being disposed on an inner side of the inner door frame assembly and coupled to the door panel to drive the door panel to move inside the inner door frame assembly in a Y-axis direction, the second driving devices each including a second driver unit and a second connection plate, the second driver unit being fixed to the door frame posts and being coupled through the second connection plate to the door panel, so that the second driver unit drives the door panel to move inside the inner door frame assembly in the Y-axis direction;
wherein the first driving device and the second driving devices are in electric connection with a control platform.

10. The automatized mechanical opening/closing device according to claim 9, wherein the second driving devices are arranged pairwise to be respectively disposed at upper and lower ends of the door frame posts.

11. The automatized mechanical opening/closing device according to claim 10, wherein the second driver unit comprises a pneumatic cylinder.

12. The automatized mechanical opening/closing device according to claim 9, wherein the door frame top board and the door frame bottom board are provided, on inner sides thereof, with a plurality of second rails, the second rails being arranged parallel and coupled with sliding units provided on the top and bottom sides of the door panel.

13. The automatized mechanical opening/closing device according to claim 12, wherein the sliding units each comprise a slide block and a third connection plate, the slide block being movably coupled with the second rails, the slide block being connected through the third connection plate to the door panel.

14. The automatized mechanical opening/closing device according to claim 13, wherein a stop block is provided at each of a front end and a rear end of the second rails.

15. The automatized mechanical opening/closing device according to claim 13, wherein the third connection plate comprises an L-shaped connection plate.

16. The automatized mechanical opening/closing device according to claim 15, wherein a surface of the third connection plate that is mounted to the door panel is mounted by means of at least one floating joint.

\* \* \* \* \*